United States Patent
Komasaki et al.

(10) Patent No.: US 10,498,198 B2
(45) Date of Patent: Dec. 3, 2019

(54) MAGNETIC SENSOR

(71) Applicant: TDK Corporation, Tokyo (JP)

(72) Inventors: Yosuke Komasaki, Tokyo (JP); Naoki Ohta, Tokyo (JP); Hayato Miyashita, Tokyo (JP); Takakazu Imai, Tokyo (JP); Hiraku Hirabayashi, Tokyo (JP); Masanori Sakai, Tokyo (JP); Satoshi Abe, Tokyo (JP); Tsuyoshi Umehara, Tokyo (JP)

(73) Assignee: TDK Corporation, Tokyo (JP)

( * ) Notice: Subject to any disclaimer, the term of this patent is extended or adjusted under 35 U.S.C. 154(b) by 66 days.

(21) Appl. No.: 15/831,508

(22) Filed: Dec. 5, 2017

(65) Prior Publication Data
US 2018/0254686 A1 Sep. 6, 2018

(30) Foreign Application Priority Data
Mar. 2, 2017 (JP) .................... 2017-39101

(51) Int. Cl.
| | |
|---|---|
| *H02K 11/215* | (2016.01) |
| *H02P 6/16* | (2016.01) |
| *G01R 15/20* | (2006.01) |
| *H01L 43/08* | (2006.01) |
| *G01R 33/09* | (2006.01) |
| *H01L 27/22* | (2006.01) |

(52) U.S. Cl.
CPC ......... *H02K 11/215* (2016.01); *G01R 15/205* (2013.01); *G01R 33/091* (2013.01); *G01R 33/093* (2013.01); *H01L 27/22* (2013.01); *H01L 43/08* (2013.01); *H02P 6/16* (2013.01)

(58) Field of Classification Search
CPC ...... G06K 1/00; G06K 2207/00; H01L 21/00; H01L 2221/00
See application file for complete search history.

(56) References Cited

U.S. PATENT DOCUMENTS

| | | | | |
|---|---|---|---|---|
| 4,683,429 | A | * 7/1987 | Popovic | ................. G01R 33/06 324/225 |
| 2003/0080442 | A1* | 5/2003 | Unger | ................... B01L 3/5025 257/787 |

(Continued)

FOREIGN PATENT DOCUMENTS

| | | | | |
|---|---|---|---|---|
| GB | | 2035575 A | * 6/1980 | ............. G01D 5/145 |
| JP | H11-202037 A | | 7/1999 | |

*Primary Examiner* — Huy Q Phan
*Assistant Examiner* — Temilade S Rhodes-Vivour
(74) *Attorney, Agent, or Firm* — Posz Law Group, PLC (57) ABSTRACT

A magnetic sensor includes a magnetic detection element circuit that includes first and second magnetic detection elements, which are connected in series, and an output terminal, which is positioned between the first and second magnetic detection elements; an impedance matching device, which has a prescribed input voltage range and is connected to an output terminal of the magnetic detection element circuit; a first current supply source, which supplies an electric current to the magnetic detection element circuit; and a second current supply source, which supplies an electric current to the impedance matching device. A resistor is provided between the output terminal of the magnetic detection element circuit and the first current supply source and/or a reference electric potential point.

13 Claims, 8 Drawing Sheets

(56) References Cited

U.S. PATENT DOCUMENTS

| | | | | |
|---|---|---|---|---|
| 2006/0225521 A1* | 10/2006 | Von Beck | ............... | G01L 3/102 |
| | | | | 73/862.331 |
| 2010/0219822 A1* | 9/2010 | Suzuki | ................. | G01D 1/00 |
| | | | | 324/252 |
| 2011/0204887 A1* | 8/2011 | Ausserlechner | ..... | G01R 15/202 |
| | | | | 324/251 |
| 2016/0282144 A1* | 9/2016 | Komasaki | ............. | H01F 7/0273 |

* cited by examiner

FIG.17 ated States Patent US 10,498,198 B2

MAGNETIC SENSOR

CROSS REFERENCE TO RELATED APPLICATIONS

The present application is based on Japanese Patent Application No. 2017-39101 filed on Mar. 2, 2017, the disclosure of which is incorporated herein by reference.

FIELD OF THE INVENTION

The present invention relates to a magnetic sensor.

BACKGROUND OF THE INVENTION

Conventionally, a position detection apparatus has been used in machine tools and the like for detecting the position and amount of movement (amount of change) through rotational movement or linear movement of a moving body. Such a position detection apparatus has been known to be provided with a magnetic sensor capable of detecting change in an external magnetic field accompanying movement of a moving body, and a signal indicating the relative positional relationship between the moving body and the magnetic sensor is output from the magnetic sensor.

A magnetic sensor used in this kind of position detection apparatus has been known to be provided with a magnetic detection element circuit including a plurality of magnetic detection elements, an operational amplifier that amplifies the output signal from the magnetic detection element circuit, and a signal processing circuit for calculating the relative position of the moving body and the magnetic sensor by processing the output signal from the operational amplifier.

PRIOR ART

Patent Literature

[PATENT LITERATURE 1] JP Laid-Open Patent Application No. H11-202037

SUMMARY OF THE INVENTION

Problem to be Solved by the Invention

An impedance matching device such as an operational amplifier or the like as an analog front end (AFE) for amplifying the signal (analog signal) output from the magnetic detection element circuit typically has a prescribed input voltage range. When the output voltage from the magnetic detection element circuit exceeds the input voltage range of the impedance matching device, there is a fear that the impedance matching device could output an erroneous signal to the signal processing circuit.

When a GMR element, a TMR element or the like that has a high sensitivity to external magnetic fields is used as the magnetic detection element included in the magnetic detection element circuit, the output voltage from the magnetic detection element circuit becomes large compared to cases in which a Hall element or the like is used as the magnetic detection element. Consequently, there is a problem that the output voltage from the magnetic detection circuit often exceeds the input voltage range of the impedance matching device. In particular, when the system supplying electric current to the magnetic detection element circuit and the system supplying electric current to the impedance matching device are separate systems in consideration of the safety of the functions of the magnetic sensor, there is a fear that the output voltage from the magnetic detection element circuit could exceed the input voltage range of the impedance matching device.

When the output voltage from the magnetic detection element circuit exceeds the input voltage range of the impedance matching device in the magnetic sensor, it is also conceivable to change the impedance matching device to one having a larger input voltage range. However, to change the impedance matching device, it is also necessary to change the power source IC including the voltage regulator and the like, and the design cost of the magnetic sensor could rise.

In view of the above problems, it is an object of the present invention to provide a magnetic sensor in which the system supplying electric current to the magnetic detection element circuit and the system supplying electric current to the impedance matching device are separate systems and in which it is possible to control the output voltage from the magnetic sensor element circuit to be within the input voltage range of the impedance matching device.

Means for Solving the Problem

In order to resolve the above-described problem, the present invention provides a magnetic sensor including: a magnetic detection element circuit that includes a first magnetic detection element and a second magnetic detection element, which are connected in series, and an output terminal, which is positioned between the first magnetic detection element and the second magnetic detection element; an impedance matching device, which has a prescribed input voltage range, connected to the output terminal of the magnetic detection element circuit; a first current supply source, which supplies an electric current to the magnetic detection element circuit; and a second current supply source, which supplies an electric current to the impedance matching device; wherein a resistor is provided between the output terminal of the magnetic detection element circuit and the first current supply source and/or between the output terminal of the magnetic detection element circuit and a reference electric potential point.

With the above-described invention, it is possible to control the output voltage from the magnetic sensor element circuit to be within the input voltage range of the impedance matching device, even when the system supplying electric current to the magnetic detection element circuit and the system supplying electric current to the impedance matching device are separate systems.

The first magnetic detection element and the second magnetic detection element are preferably magnetoresistance effect elements, and the resistor is preferably composed by a material differing from that of the first magnetic detection element and the second magnetic detection element, and the resistor preferably has a temperature coefficient of resistance that differs from that of the first magnetic detection element and the second magnetic detection element.

The first magnetic detection element and the second magnetic detection element are preferably GMR elements or TMR elements, and preferably the first magnetic detection element and the second magnetic detection element have a negative temperature coefficient of resistance and the resistor has a positive temperature coefficient of resistance.

The resistance values and temperature coefficients of resistance of the resistor provided between the output terminal of the magnetic detection element circuit and the first current supply source and the resistor provided between the output terminal of the magnetic detection element circuit and the reference electric potential point, and the resistance values and the temperature coefficients of resistance in a zero magnetic field of the first magnetic detection element and the second magnetic detection element preferably have the relationship indicated by the following equation:

$$R_1 \times TC_{R1} + R_{X1} \times TC_{MR1} = R_2 \times TC_{R2} + R_{X2} \times TC_{MR2} = 0,$$

where $R_1$ indicates the resistance value ($\Omega$) of the resistor provided between the output terminal of the magnetic detection element circuit and the first current supply source, $R_2$ indicates the resistance value ($\Omega$) of the resistor provided between the output terminal of the magnetic detection element circuit and the reference electric potential point, $R_{X1}$ indicates the resistance value ($\Omega$) of the first magnetic detection element in a zero magnetic field, $R_{X2}$ indicates the resistance value ($\Omega$) of the second magnetic detection element in a zero magnetic field, $TC_{R1}$ indicates the temperature coefficient of resistance (° C.$^{-1}$) of the resistor provided between the output terminal of the magnetic detection element circuit and the first current supply source, $TC_{R2}$ indicates the temperature coefficient of resistance (° C.$^{-1}$) of the resistor provided between the output terminal of the magnetic detection element circuit and the reference electric potential point, $TC_{MR1}$ indicates the temperature coefficient of resistance (° C.$^{-1}$) of the first magnetic detection element, and $TC_{MR2}$ indicates the temperature coefficient of resistance (° C.$^{-1}$) of the second magnetic detection element.

Preferably, the first current supply source is a constant-current supply source that supplies a constant electric current to the magnetic detection element circuit, and the second current supply source is a constant-voltage supply source that supplies a constant voltage to the impedance matching device.

An operational amplifier can be used as the impedance matching device, and the magnetic detection element circuit may further include a third magnetic detection element and a fourth magnetic detection element connected in series and may have a bridge circuit in which a series circuit of the first magnetic detection element and the second magnetic detection element and a series circuit of the third magnetic detection element and the fourth magnetic detection element are connected in parallel.

At least the first magnetic detection element and the second magnetic detection element may be integrated on the same chip, and the magnetic sensor may further include a sealing part that integrally seals at least the first magnetic detection element, the second magnetic detection element and the resistor.

Effects of the Invention

With the present invention, it is possible to provide a magnetic sensor in which the system supplying electric current to the magnetic detection element circuit and the system supplying electric current to the impedance matching device are separate systems and in which it is possible to control the output voltage from the magnetic sensor element circuit to within the input voltage range of the impedance matching device.

DETAILED DESCRIPTION OF THE INVENTION

Figure 1:
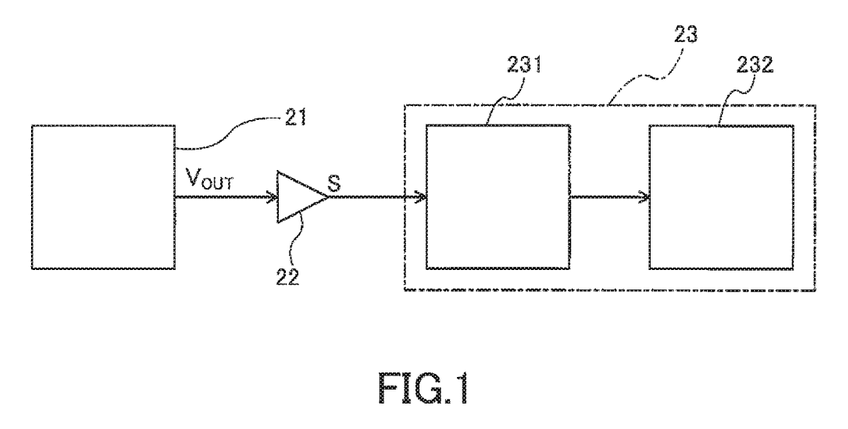
FIG. 1 is a block diagram showing a schematic configuration of a magnetic sensor according to an embodiment of the present invention.
Figure 2:
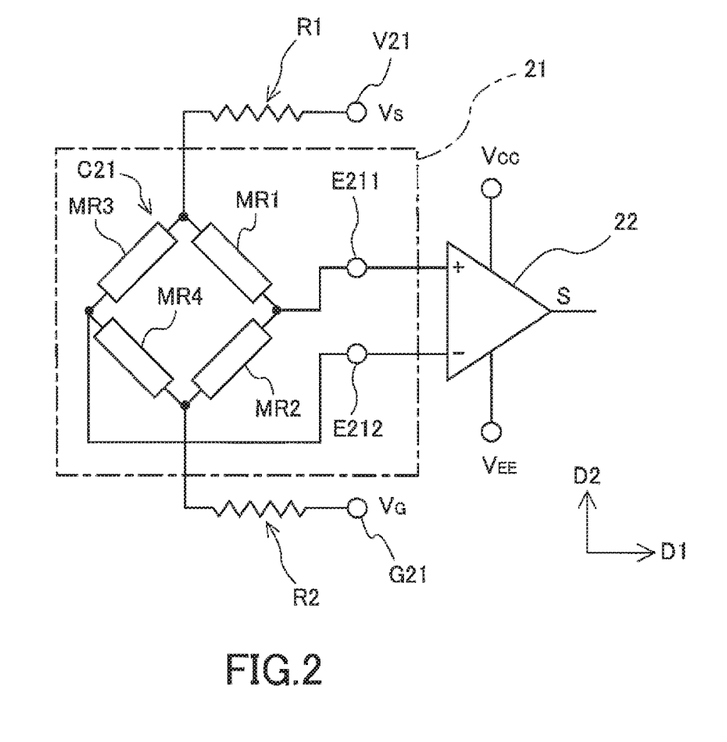
FIG. 2 is a circuit diagram showing a schematic configuration of a magnetic detection element circuit according to the embodiment of the present invention.
Figure 3:
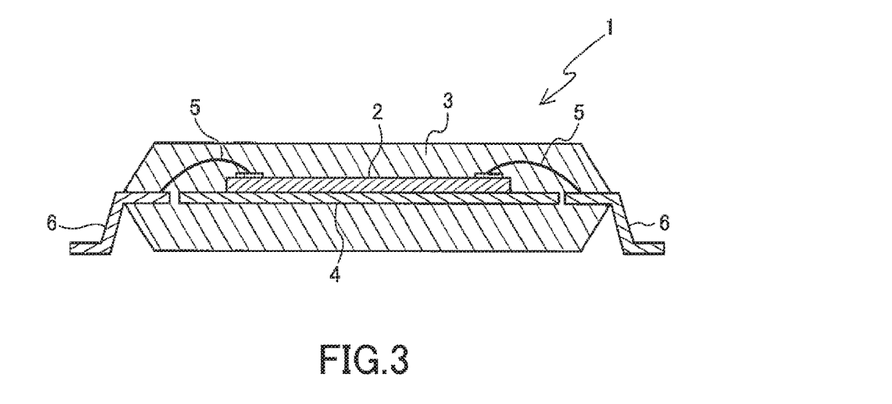
FIG. 3 is a cross-sectional view showing the schematic configuration of a magnetic sensor package according to the embodiment of the present invention.

The preferred embodiments of the present invention will be described with reference to the drawings. FIG. 1 is a block diagram showing a schematic configuration of a magnetic sensor according to this embodiment, FIG. 2 is a circuit diagram showing a schematic configuration of a magnetic detection element circuit according to this embodiment, and FIG. 3 is a cross-sectional view showing the schematic configuration of a magnetic sensor package according to this embodiment.

The magnetic sensor according to this embodiment includes a magnetic sensor package 1, an impedance matching device 22 and an arithmetic processing circuit 23. The magnetic sensor package 1 has a base 4, a magnetic sensor 2 provided on the base 4, a connection lead 6, a wiring part 5 such as bonding wire or the like that electrically connects the magnetic sensor 2 and the connection lead 6, and a sealing part 3 that seals these into a single body. The sealing part 3 is composed by resin material such as epoxy resin or the like, for example.

The magnetic sensor 2 has a magnetic detection element circuit 21 that outputs a detection signal $V_{OUT}$ accompanying change in the external magnetic field, and a first resistor R1 and a second resistor R2. The magnetic detection element circuit 21, the first resistor R1 and the second resistor R2 may be accumulated on a semiconductor substrate (undepicted) such as a single silicon wafer or the like, that is, on the same chip, or the magnetic detection element circuit 21 may be accumulated on a first chip, the first resistor R1 on a second chip differing from the first chip, and the second resistor R2 on a third chip differing from the first chip and the second chip.

The impedance matching device 22 is configured by an operational amplifier 22 that is connected to the magnetic detection element circuit 21 and that amplifies the detection signal $V_{OUT}$ and outputs the sensor signal S.

Figure 4:
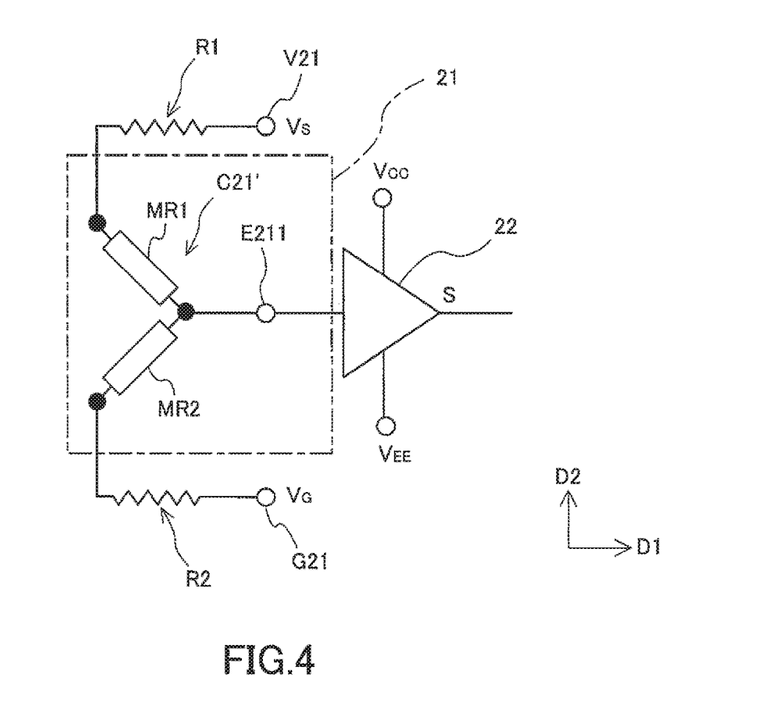
FIG. 4 is a circuit diagram showing the schematic configuration of another state of the magnetic detection element circuit according to the embodiment of the present invention.

The magnetic detection element circuit 21 has a Wheatstone bridge circuit including at least one magnetic detection element pair configured by two magnetic detection elements connected in series. As shown in FIG. 2, in this embodiment, the magnetic detection element circuit 21 has a Wheatstone bridge circuit C21 including a first magnetic detection element pair in which a first magnetic detection element MR1 and a second magnetic detection element MR2 are connected in series, and a second magnetic detection element pair in which a third magnetic detection element MR3 and a fourth magnetic detection element MR4 are connected in series. As shown in FIG. 4, the magnetic detection element circuit 21 may have a half bridge circuit C21' including only the first magnetic detection element pair but not including the second magnetic detection element pair.

As shown in FIG. 2, the Wheatstone bridge circuit C21 includes the first magnetic detection element pair, the second magnetic detection element pair, a power source port V21 connected to one end each of the first magnetic detection element MR1 and the third magnetic detection element MR3, a ground port G21 connected to one end each of the second magnetic detection element MR2 and the fourth magnetic detection element MR4, a first output port E211 and a second output port E212. The first output port E211 is connected between (at the midpoint of) the first magnetic detection element MR1 and the second magnetic detection element MR2 in the first magnetic detection element pair. The second output port E212 is connected between (at the midpoint of) the third magnetic detection element MR3 and the fourth magnetic detection element MR4 in the second magnetic detection element pair. The power source port V21 is connected to a first power source supply source Vs capable of supplying an electric current to the magnetic detection element circuit 21, and the ground port G21 is connected to ground (reference electric potential point) $V_G$. The first power source supply source $V_S$ may be a constant-voltage power source capable of supplying a constant voltage, or a constant-current power source capable of supplying a constant current.

The first resistor R1 is positioned between the first power source supply source $V_S$ and the first output port E211 or the second output port E212. The second resistor R2 is positioned between the ground (reference electric potential point) $V_G$ and the first output port E211 or the second output port E212. By having these resistors (the first resistor R1 and the second resistor R2), the detection signal $V_{OUT}$ can be output within an output range that does not exceed the input voltage range of the operational amplifier 22. The magnetic sensor according to this embodiment has the first resistor R1 and the second resistor R2 but is not limited to this state. For example, it would be fine for the magnetic sensor according to this embodiment to include either one of the first resistor R1 or the second resistor R2 but not include the other, in accordance with the relationship between the input voltage range of the operational amplifier 22 and the output voltage of the detection signal $V_{OUT}$ output from the magnetic detection element circuit 21 (the Wheatstone bridge circuit C21).

Figure 5:
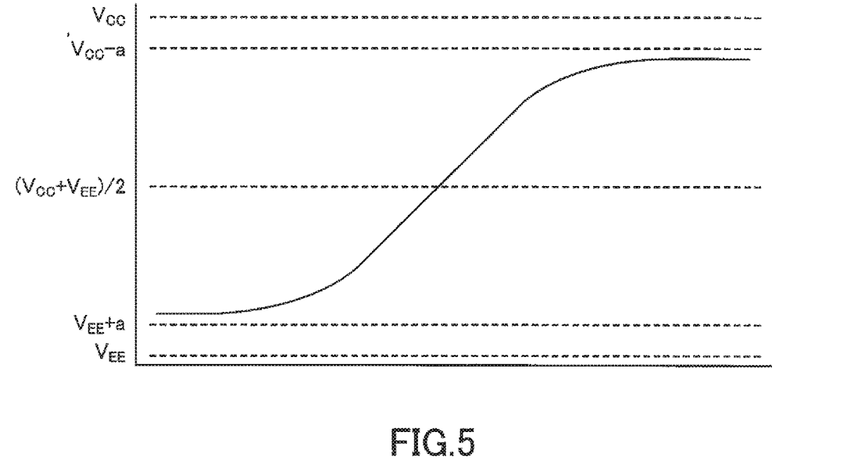
FIG. 5 is a graph showing the relationship between the output voltage from the magnetic detection element circuit and the input voltage range of the impedance matching device according to the embodiment of the present invention.

The resistance values of the first resistor R1 and the second resistor R2 are not particularly limited. By appropriately setting these two resistance values, as shown in FIG. 5, it becomes possible to output the detection signal $V_{OUT}$ in an output range that does not exceed the input voltage range ($V_{CC}$–a~$V_{EE}$+a) of the operational amplifier 22 and also to effectively match the median value of the amplitude of the detection signal $V_{OUT}$ to the midpoint (($V_{CC}$+$V_{EE}$)/2) of the input voltage range of the operational amplifier 22. The input voltage range ($V_{CC}$–a~$V_{EE}$+a) of the operational amplifier 22 is an input voltage range for ensuring a dynamic range, appropriately set based on the maximum common-mode input voltage range ($V_{CC}$~$V_{EE}$) of the operational amplifier 22.

Examples of the first through fourth magnetic detection elements MR1~MR4 included in the Wheatstone bridge circuit C21, include Hall elements, AMR elements, GMR elements, TMR elements or the like, and GMR elements and TMR elements, which have relatively large output voltage, are particularly preferred.

Figure 6:
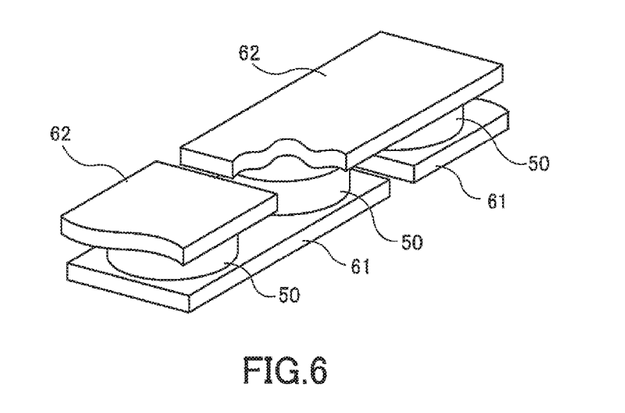
FIG. 6 is a perspective view showing the schematic configuration of the first through fourth magnetic detection elements according to the embodiment of the present invention.

GMR elements or TMR elements as the first through fourth magnetic detection elements MR1~MR4 have a plurality of lower lead electrodes 61, a plurality of MR laminated bodies 50 and a plurality of upper lead electrodes 62, as shown in FIG. 6. The lower lead electrodes 61 and the upper lead electrodes 62 are composed of one type of conductive material out of Cu, Al, Au, Ta, Ti or the like, for example, or a compound film of two or more of these conductive materials, and the thicknesses thereof are around 0.3~2.0 µm each.

The plurality of lower lead electrodes 61 is provided on a substrate (unrepresented). Each of the lower lead electrodes 61 has a long, slender, roughly rectangular shape, and the lower lead electrodes 61 are provided such that there is a prescribed gap between two adjacent lower lead electrodes 61 in the electrical series direction of the plurality of MR laminated bodies 50 arranged in an array. In the vicinity of both ends of the lower lead electrodes 61 in the lengthwise direction, the MR laminated bodies 50 are provided. That is, two MR laminated bodies 50 are provided on each of the plurality of lower lead electrodes 61.

Figure 7:
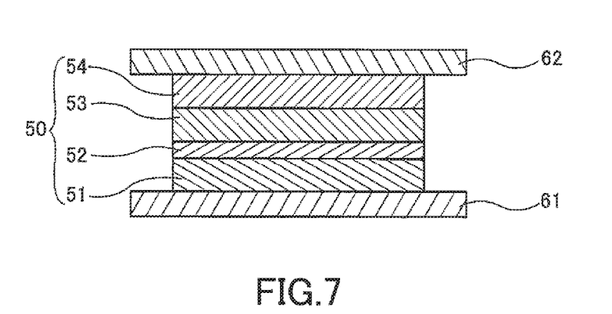
FIG. 7 is a cross-sectional view showing the schematic configuration of the first through fourth magnetic detection elements according to the embodiment of the present invention.

The MR laminated bodies 50 according to this embodiment have a magnetization pinned layer 53 in which the magnetization direction is fixed, a free layer 51 in which the magnetization direction changes in accordance with the direction of an applied magnetic field, a nonmagnetic layer 52 positioned between the magnetization pinned layer 53 and the free layer 51, and an antiferromagnetic layer 54, as shown in FIG. 7.

The MR laminated bodies 50 have a structure in which the free layer 51, the nonmagnetic layer 52, the magnetization pinned layer 53 and the antiferromagnetic layer 54 are laminated in that order from the lower lead electrode 61 side. The free layer 51 is electrically connected to the lower lead electrode 61, and the antiferromagnetic layer 54 is electrically connected to the upper lead electrode 62. Examples of materials composing the free layer 51 and the magnetization pinned layer 53, include, NiFe, CoFe, CoFeB, CoFeNi, Co$_2$MnSi, Co$_2$MnGe, FeOx (oxides of Fe), or the like. The thicknesses of the free layer 51 and the magnetization pinned layer 53 are around 1~20 nm each.

The nonmagnetic layer 52 is a spacer layer and is a film that is essential for causing the tunnel magnetoresistance effect (TMR effect) or the giant magnetoresistance effect (GMR effect) to be realized in the MR laminated body 50. Examples of materials composing the nonmagnetic layer 52 include oxides such as MgO, Mg—Al—O, Al—O, or the like, or metal materials such as Cu, Au, Ag, Cr, Ag—Zn, Ni—Al, or the like. The thickness of the nonmagnetic layer 52 is around 0.1~5 nm.

The antiferromagnetic layer 54 is composed of antiferromagnetic materials containing Mn and at least one type of element selected from a group including Pt, Ru, Rh, Pd, Ni, Cu, Ir, Cr and Fe, for example. The Mn content in this antiferromagnetic material is, for example, around 35~95 atom %. The antiferromagnetic layer 54 composed of the antiferromagnetic material is exchange coupled with the magnetization pinned layer 53, and serves the role of fixing the direction of magnetization of the magnetization pinned layer 53.

The plurality of upper lead electrodes 62 is provided on the plurality of MR laminated bodies 50. Each of the upper lead electrodes 62 has a long, slender, roughly rectangular shape. The upper lead electrodes 62 are provided to have a prescribed gap between two adjacent upper lead electrodes 62 in the electrical series direction of the plurality of MR laminated bodies 50 arranged in an array and so that the MR laminated bodies 50 are connected in series, with the antiferromagnetic layers 54 of two adjacent MR laminated bodies 50 electrically connected to each other. The MR laminated bodies 50 may have a configuration in which the antiferromagnetic layer 54, the magnetization pinned layer 53, the nonmagnetic layer 52 and the free layer 51 are laminated in that order from the lower lead electrode 61. In addition, a cap layer (protective layer) may be provided between the free layer 51 and the lower lead electrode 61 or the upper lead electrode 62.

In the MR laminated bodies 50, the resistance value changes in accordance with the angle formed between the direction of magnetization of the free layer 51 and the direction of magnetization of the magnetization pinned layer 53, the resistance value becomes a minimum when this angle is 0° (when the magnetization directions are mutually parallel), and the resistance value becomes a maximum when this angle is 180° (when the magnetization directions are mutually antiparallel).

The first resistor R1 and the second resistor R2 are composed of material differing from the first through fourth magnetic detection elements MR1~MR4 and, for example, are composed of a metal material such as Ni, Cr, W, Ti, Ta, NiCr, FeCr, CuNi, CuMn, MnNi, or the like, or an additive-containing metal material such as these to which an additive such as nitrogen, Ge, B or the like has been added. The first through fourth magnetic detection elements MR1~MR4 can be composed of a plurality of materials (for example, if TMR elements, materials composing each of the layers (the free layer 51, the nonmagnetic layer 52, the magnetization pinned layer 53 and the antiferromagnetic layer 54) of the MR laminated body 50, the lower lead electrodes 61 and the upper lead electrodes 62, respectively), and it can be considered that it is composed by a compound material formed by integrating the plurality of materials. In this sense, the first resistor R1 and the second resistor R2 are composed of materials differing from the materials (compound materials) composing the first through fourth magnetic detection elements MR1~MR4. Preferably, the temperature coefficient of resistance (° C.$^{-1}$) of the first resistor R1 and second resistor R2, and the temperature coefficient of resistance (° C.$^{-1}$) of the first through fourth magnetic detection elements MR1~MR4 have mutually differing positive/negative signs. Since the positive/negative signs of the temperature coefficient of resistances of the first resistor R1 and second resistor R2 and the first through fourth magnetic detection elements MR1~MR4 mutually differ, it is more difficult for the output voltage of the detection signal V$_{OUT}$ from the magnetic detection element circuit 21 and the consumed power to be affected by the ambient temperature.

In particular, preferably, the temperature coefficient of resistance of the first resistor R1 and second resistor R2 is positive, and the temperature coefficient of resistance of the first through fourth magnetic detection elements MR1~MR4 is negative. Through this, it is possible to reduce the temperature coefficient of resistance for the Wheatstone bridge circuit C21 as a whole, so it is more difficult for the output voltage of the detection signal V$_{OUT}$ from the magnetic detection element circuit 21 and the consumed power to be affected by the ambient temperature. The temperature coefficient of resistance of the first resistor R1 and second resistor R2 and the temperature coefficient of resistance of the first through fourth magnetic detection elements MR1~MR4 preferably satisfy both of the following Equations (1) and Equation (2).

$$R_1 \times TC_{R1} + R_{X1} \times TC_{MR1} = R_2 \times TC_{R2} + R_{X2} \times TC_{MR2} = 0 \quad (1)$$

$$R_1 \times TC_{R1} + R_{X3} \times TC_{MR3} = R_2 \times TC_{R2} + R_{X4} \times TC_{MR4} = 0 \quad (2)$$

In Equation (1) and Equation (2), R$_{X1}$ indicates the resistance value (Ω) of the first magnetic detection element MR1 in a zero magnetic field, R$_{X2}$ indicates the resistance value (Ω) of the second magnetic detection element MR2 in a zero magnetic field, $R_{X3}$ indicates the resistance value (Ω) of the third magnetic detection element MR3 in a zero magnetic field, $R_{X4}$ indicates the resistance value (Ω) of the fourth magnetic detection element MR4 in a zero magnetic field, $TC_{MR1}$ indicates the temperature coefficient of resistance (° C.$^{-1}$) of the first magnetic detection element MR1, $TC_{MR2}$ indicates the temperature coefficient of resistance (° C.$^{-1}$) of the second magnetic detection element MR2, $TC_{MR3}$ indicates the temperature coefficient of resistance (° C.$^{-1}$) of the third magnetic detection element MR3, $TC_{MR4}$ indicates the temperature coefficient of resistance (° C.$^{-1}$) of the fourth magnetic detection element MR4, $R_1$ denotes the resistance value (Ω) of the first resistor R1, R2 indicates the resistance value (Ω) of the second resistor R2, $TC_{R1}$ indicates the temperature coefficient of resistance (° C.$^{-1}$) of the first resistor R1 and $TC_{R2}$ indicates the temperature coefficient of resistance (° C.$^{-1}$) of the second resistor R2.

When the first power supply source $V_S$ is a constant-current power source, the temperature coefficient of resistance of the second resistor R2 and the temperature coefficients of resistance of the second magnetic detection element MR2 and the fourth magnetic detection element MR4 preferably have the relationship indicated by the following Equation (3).

$$R_{X2} \times TC_{MR2} = R_{X4} \times TC_{MR4} = -R_2 \times TC_{R2} \quad (3)$$

In Equation (3), $R_{X2}$ indicates the resistance value (Ω) of the second magnetic detection element MR2 in a zero magnetic field, $R_{X4}$ indicates the resistance value (Ω) of the fourth magnetic detection element MR4 in a zero magnetic field, $TC_{MR2}$ indicates the temperature coefficient of resistance (° C.$^{-1}$) of the second magnetic detection element MR2, $TC_{MR4}$ indicates the temperature coefficient of resistance (° C.$^{-1}$) of the fourth magnetic detection element MR4, R2 indicates the resistance value (Ω) of the second resistor R2 and $TC_{R2}$ indicates the temperature coefficient of resistance (° C.$^{-1}$) of the second resistor R2.

When the magnetic detection element circuit 21 includes the half bridge circuit C21' (see FIG. 4), the above-described Equation (3) can be expressed by the following Equation (4).

$$R_{X2} \times TC_{MR2} = -R_2 \times TC_{R2} \quad (4)$$

In Equation (4), $R_{X2}$ indicates the resistance value (Ω) of the second magnetic detection element in a zero magnetic field, $TC_{MR2}$ indicates the temperature coefficient of resistance (° C.$^{-1}$) of the second magnetic detection element, R2 indicates the resistance value (Ω) of the second resistor R2 and $TC_{R2}$ indicates the temperature coefficient of resistance (° C.$^{-1}$) of the second resistor R2.

In this embodiment, the non-inverting input terminal (plus terminal) of the operational amplifier 22 is connected to the first output port E211, and the inverting input terminal (minus terminal) is connected to the second output port E212. The power source terminals of the operational amplifier 22 are respectively connected to a second power source supply source $V_{CC}$, which is capable of supplying a constant voltage to the operational amplifier 22, and a ground (reference electric potential point) $V_{EE}$. The detection signal $V_{OUT}$ within the input voltage range of the operational amplifier 22 is input into the operational amplifier 22, is differentially amplified by the operational amplifier 22 and is output as the sensor signal S.

The arithmetic processing circuit 23 includes an A/D (analog/digital) converter 231 that converts the analog signal (sensor signal S) output from the impedance matching device 22 into a digital signal, and an arithmetic processing part 232 that performs arithmetic processing on the digital signal, which is converted to digital by the A/D converter 231, and calculates the physical quantity (for example, the amount of movement of the moving body, or the like).

In the magnetic detection element circuit 21 of the magnetic sensor according to this embodiment, the magnetization directions of the magnetization pinned layers 53 of the first through fourth magnetic detection elements MR1~MR4 are parallel to a first direction D1. The magnetization direction of the magnetization pinned layers 53 of the first magnetic detection element MR1 and the fourth magnetic detection element MR4, and the magnetization direction of the magnetization pinned layers 53 of the second magnetic detection element MR2 and the third magnetic detection element MR3 are antiparallel to each other. In this case, the waveform of the detection signal $V_{OUT}$ is a cosine waveform dependent on the physical quantity.

In the magnetic detection element circuit 21, the electric potential difference between the first output port E211 and the second output port E212 changes in accordance with changes in an external magnetic field, and the detection signal $V_{OUT}$ is output as a signal expressing the magnetic field intensity. The impedance matching device 22 differentially amplifies the detection signal $V_{OUT}$ corresponding to the electric potential difference between the first output port E211 and the second output port E212 and outputs the result to the A/D converter 231 as the sensor signal S.

The A/D converter 231 converts the sensor signal S (analog signal relating to the physical quantity) output from the impedance matching device 22 into a digital signal and inputs this digital signal into the arithmetic processing part 232.

The arithmetic processing part 232 accomplishes arithmetic processing on the digital signal converted from the analog signal by the A/D converter 231 and calculates the physical quantity. This arithmetic processing part 232 is configured by a microcomputer or the like, for example.

Figure 8:
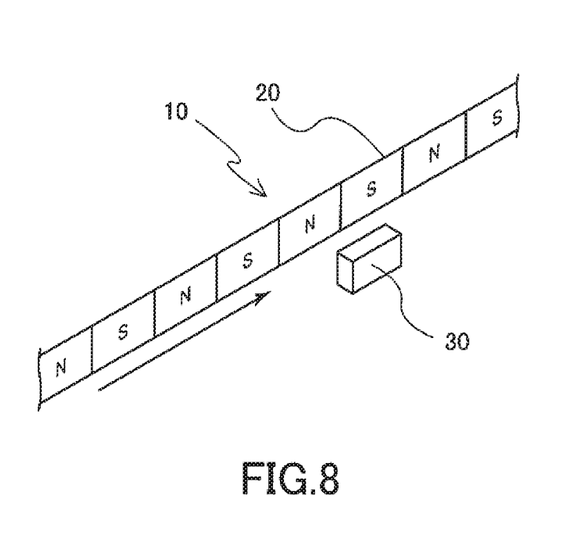
FIG. 8 is a perspective view showing the schematic configuration of a position detection apparatus according to the embodiment of the present invention.

The magnetic sensor having the above-described configuration can be used as a constituent element in a position detection apparatus. FIG. 8 is a perspective view showing the schematic configuration of a position detection apparatus using the magnetic sensor according to this embodiment.

As shown in FIG. 8, a position detection apparatus 10 according to this embodiment includes a magnetic sensor 30, according to this embodiment, and a moving body 20, which is capable of moving relative to the magnetic sensor 30. In this embodiment, the explanation will take as an example a linear encoder provided with a moving body 20 that moves linearly in a prescribed direction relative to the magnetic sensor 30, as the position detection apparatus 10. In the state shown in FIG. 8, the moving body 20 is a magnetic scale in which N poles and S poles are magnetized alternately in the lengthwise direction.

The arithmetic processing part 232 in the magnetic sensor 30 (see FIG. 1) accomplishes arithmetic processing on the digital signal converted from an analog signal by the A/D converter 231 (see FIG. 1) and calculates the relative amount of movement of the moving body 20 as the physical quantity.

In the position detection device 10, according to this embodiment and having the above-described configuration, when the external magnetic field changes accompanying movement of the moving body 20 relative to the magnetic sensor 30, the resistance values of the first through fourth magnetic detection elements MR1~MR4 of the magnetic detection element circuit 21 change according to the change in the external magnetic field, and the detection signal $V_{OUT}$ is output from the magnetic detection element circuit 21 in accordance with the electric potential difference between the first output port E211 and the second output port E212. The detection signal $V_{OUT}$ is differentially amplified by the operational amplifier 22 and is output as the sensor signal S. Furthermore, the sensor signal S output from the operational amplifier 22 is converted to a digital signal by the A/D converter 231. Following this, the relative movement amount of the moving body 20 is calculated by the arithmetic processing part 232.

The relative movement amount calculated by the arithmetic processing part 232 is output to an electronic control unit (ECU) of an application (for example, a linear motor or the like) in which the position detection apparatus 10 according to this embodiment is installed. In the electronic control unit, movement of the application is controlled based on the above-described relative movement amount.

In the position detection apparatus 10 according to this embodiment, a signal output from the magnetic detection element circuit 21 of the magnetic sensor 30 is controlled to be within the input voltage range of the impedance matching device 22, so a signal is output accurately from the impedance matching device 22 to the arithmetic processing circuit 23. Hence, the relative movement amount of the moving body 20 can be accurately calculated.

The above-described embodiment was described to facilitate understanding of the present invention and is not described for limiting the present invention. Accordingly, each element disclosed in the above-described embodiment should be construed to include all design changes and equivalents falling within the technical scope of the present invention.

In the above-described embodiment, a configuration including a magnetic detection element circuit 21 and an operational amplifier 22 as an impedance matching device 22 was described as an example, but this is not limited to this embodiment. For example, it would be satisfactory to have a configuration in which the magnetic detection element circuit 21 includes a first magnetic detection element circuit 211 and a second magnetic detection element circuit 212, and the impedance matching device 22 includes a first operational amplifier 221, into which a first detection signal $V_{OUT1}$ output from the first magnetic detection element circuit 211 is input, and a second operational amplifier 222, into which a second detection signal $V_{OUT2}$ output from the second magnetic detection element circuit 212 is input (see FIG. 9A and FIG. 9B).

Figure 9A:
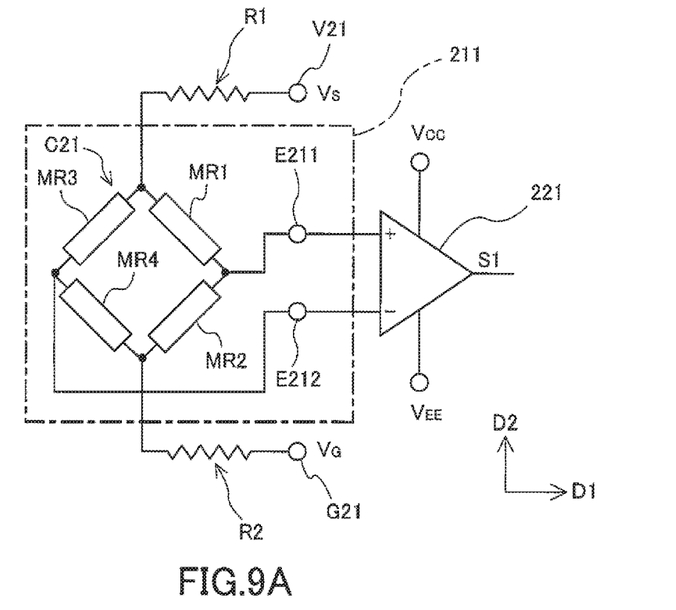
FIG. 9A is a circuit diagram showing the schematic configuration of a first magnetic detection element circuit according to the embodiment of the present invention.
Figure 9B:
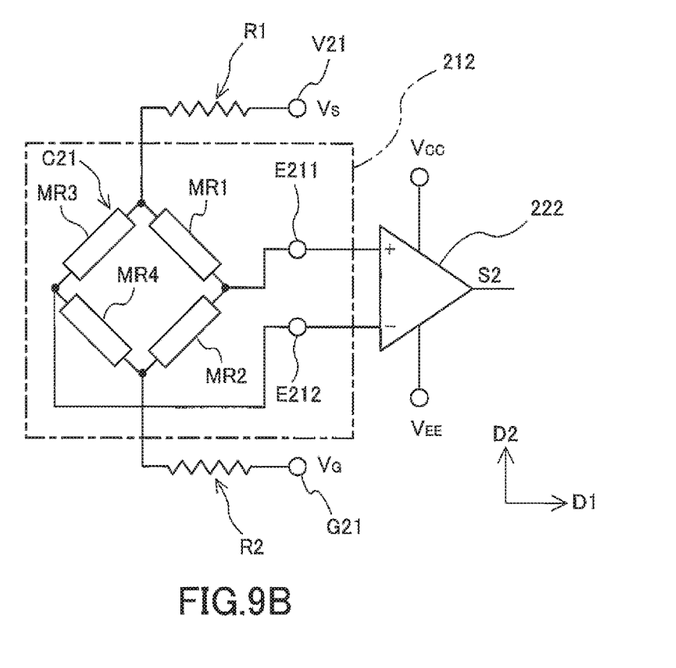
FIG. 9B is a circuit diagram showing the schematic configuration of a second magnetic detection element circuit according to the embodiment of the present invention.

In this embodiment, each of the first magnetic detection element circuit 211 and the second magnetic detection element circuit 212 has the Wheatstone bridge circuit C21 (see FIG. 2) including at least one pair of magnetic detection elements configured by two magnetic detection elements connected in series, and the first resistor R1 is provided between the first output port E211 or the second output port E212 and the first power source supply source $V_S$, and the second resistor R2 is provided between the first output port E211 or the second output port E212 and the ground (reference electric potential point) $V_G$. Through this, the first detection signal $V_{OUT1}$ and the second detection signal $V_{OUT2}$ that do not exceed the input voltage range ($V_{CC}$-a~$V_{EE}$+a) of the first operational amplifier 221 and the second operational amplifier 222 are output from the first magnetic detection element circuit 211 and the second magnetic detection element circuit 212, respectively.

In the above-described embodiment, the sealing part 3 of the magnetic sensor package 1 integrally seals the magnetic detection element circuit 21, the magnetic sensor 2, including the first resistor R1 and the second resistor R2, the base 4, the wiring part 5 and the lead 6, but this is not limited to such an embodiment. For example, the sealing part 3 of the magnetic sensor package 1 may also integrally seal the impedance matching device 22 and the arithmetic processing circuit 23, along with the magnetic detection element circuit 21, the magnetic sensor 2, including the first resistor R1 and the second resistor R2, the base 4, the wiring part 5 and the lead 6.

In the above-described embodiment, an example was described in which a linear encoder provided with a moving body 20 that moves linearly in a prescribed direction relative to the magnetic sensor 30 was taken as the position detection apparatus 10, but it is not limited to this embodiment. For example, the position detection apparatus 10 may be a rotary encoder or the like provided with a rotational moving body 20 that moves rotationally about a prescribed axis of rotation. In such a position detection apparatus 10, the magnetic sensor 30 is preferably provided with the magnetic detection element circuit 21 including the first magnetic detection element circuit 211 and the second magnetic detection element circuit 212, and the impedance matching device 22, including the first operational amplifier 221, into which the first detection signal $V_{OUT1}$ output from the first magnetic detection element circuit 211 is input, and the second operational amplifier 222, into which the second detection signal $V_{OUT2}$ output from the second magnetic detection element circuit 212 is input.

In this kind of position detection apparatus 10, when the external magnetic field changes accompanying rotational movement of the rotational moving body 20, the resistance values of the first through fourth magnetic detection elements MR1~MR4 of the first magnetic detection element circuit 211 and the second magnetic detection element circuit 212 change in accordance with the change in the external magnetic field, and the first detection signal $V_{OUT1}$ and the second detection signal $V_{OUT2}$ are output from the first magnetic detection element circuit 211 and the second magnetic detection element circuit 212 in accordance with the electric potential difference between the first output port E211 and the second output port E212. The first detection signal $V_{OUT1}$ and the second detection signal $V_{OUT2}$ are differentially amplified by the first operational amplifier 221 and the second operational amplifier 222 and are output as a first sensor signal S1 and a second sensor signal S2. Then, the first sensor signal S1 and the second sensor signal S2 output from the first operational amplifier 221 and the second operation amplifier 222 are converted into digital signals by the A/D converter 231. Following this, the rotational angle θ of the rotational moving body 20 is calculated by the arithmetic processing part 232.

The rotational angle θ calculated by the arithmetic processing part 232 is output to the electronic control unit (ECU) of the application (for example, an electric power steering apparatus or the like) in which the position detection apparatus 10 according to this embodiment is installed. In the electronic control unit, movement of the application is controlled based on the above-described rotational angle θ.

In such a position detection apparatus 10, the signals output from the magnetic detection element circuit 21 of the magnetic sensor 30 are controlled to be within the input voltage range of the impedance matching device 22, so a signal is output accurately from the impedance matching device 22 to the arithmetic processing circuit 23. Hence, the rotational movement θ of the moving body 20 can be accurately calculated.

EXAMPLES

Below, the present invention is described in greater detail by citing examples, but the present invention is not limited in any way by the below-described examples.

Example 1

Figure 10:
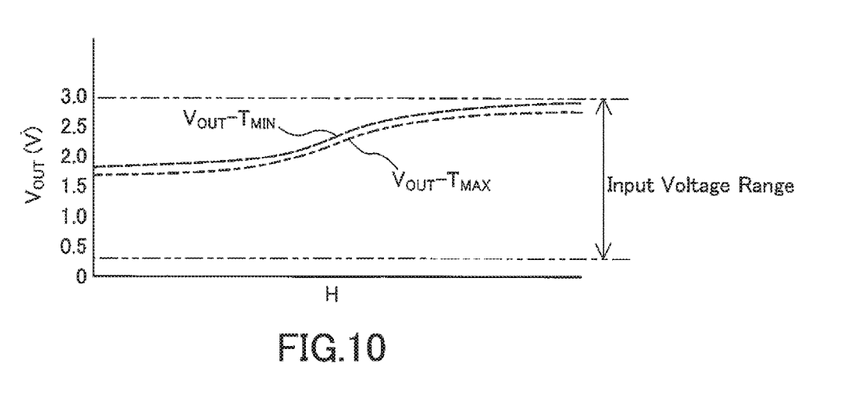
FIG. 10 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 1, and the magnetic field intensity H.

A simulation experiment was conducted on the relationship between the output voltages accompanying change in the magnetic field intensity in a circuit including the magnetic detection element circuit 21 having the half bridge circuit C21' shown in FIG. 4 along with circuits including the first resistor R1 and the second resistor R2, and the input voltage range of the operational amplifier 22. The results are shown in FIG. 10. The first power source supply source $V_S$ was assumed to be a constant-voltage power source, and simulation conditions were set as shown in Table 1.

TABLE 1

| | |
|---|---|
| Electric potential ($V_S$) of first current supply source | 5 V |
| Ground electric potential ($V_G$) | 0 V |
| Electric potential ($V_{CC}$) of second current supply source | 3.3 V |
| Ground electric potential ($V_{EE}$) | 0 V |
| Input voltage range of operational amplifier 22 | 0.3 V~3.0 V |
| Resistances ($R_X$) of first and second magnetic detection elements MR1, MR2 in zero magnetic field | 2.5 kΩ |
| Temperature coefficient of resistance ($TC_{MR}$) of first and second magnetic detection elements MR1, MR2 | −0.002° C.$^{-1}$ |
| Resistance value ($R_1$) of first resistor | 0.4 kΩ |
| Resistance value ($R_2$) of second resistor | 0 Ω |
| Temperature coefficient of resistance ($TC_R$) of first and second resistors R1, R2 | −0.002° C.$^{-1}$ |
| Maximum ambient temperature ($T_{MAX}$) | 150° C. |
| Minimum ambient temperature ($T_{MIN}$) | −40° C. |

Example 2

Figure 11:
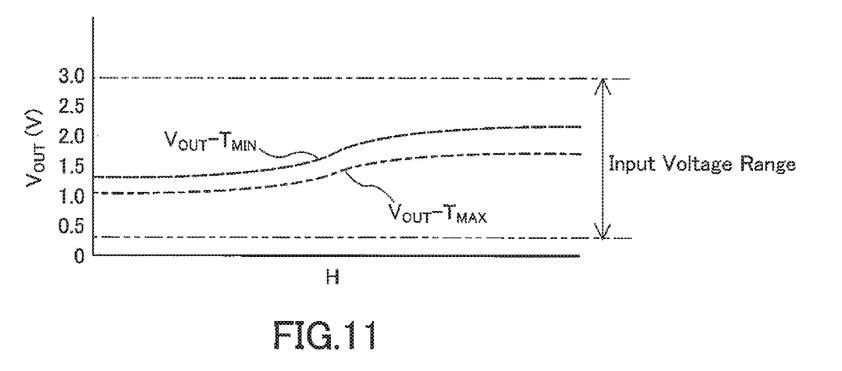
FIG. 11 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 2, and the magnetic field intensity H.

A simulation experiment was conducted in the same manner as in Example 1, except that the resistance value $R_1$ of the first resistor R1 was changed to 2.6 kΩ. The results are shown in FIG. 11.

Comparison Example 1

Figure 12:
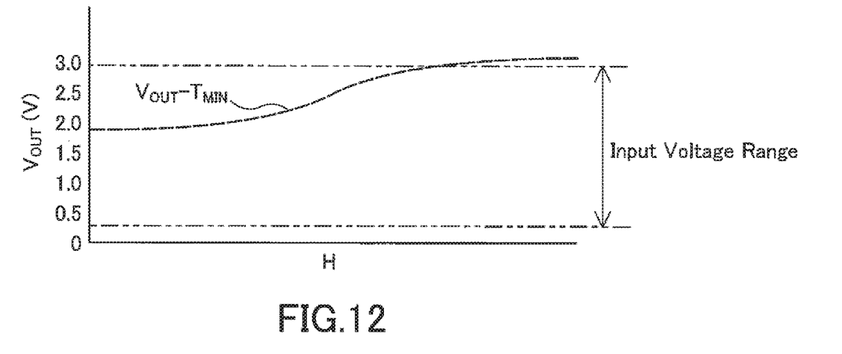
FIG. 12 is a graph showing the relationship between the output voltage (the output voltage $V_{OUT}$-$T_{MIN}$ at the minimum ambient temperature $T_{MIN}$) from the first magnetic detection element circuit according to Comparison Example 1, and the magnetic field intensity H.

A simulation experiment was conducted in the same manner as in Example 1, except that the resistance value $R_1$ of the first resistor R1 was changed to 0Ω. Results are shown in FIG. 12.

Example 3

Figure 13:
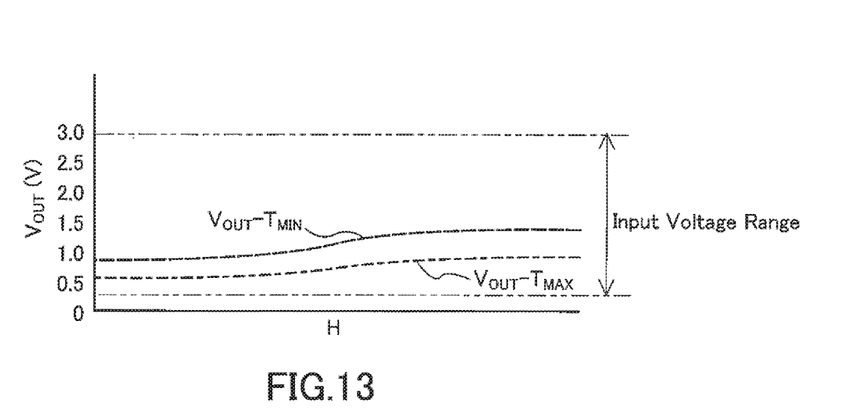
FIG. 13 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 3, and the magnetic field intensity H.

A simulation experiment was conducted on the relationship between the output voltages accompanying change in the magnetic field intensity in a circuit including the magnetic detection element circuit 21 having the half bridge circuit C21' shown in FIG. 4 along with circuits including the first resistor R1 and the second resistor R2, and the input voltage range of the operational amplifier 22. The results are shown in FIG. 13. The first power source supply source $V_S$ was assumed to be a constant-current power source, and simulation conditions were set as shown in Table 2.

TABLE 2

| | |
|---|---|
| Electric current ($I_S$) supplied to magnetic detection element circuit 21 | 0.4 mA |
| Ground electric potential ($V_G$) | 0 V |
| Electric potential ($V_{CC}$) of second current supply source | 3.3 V |
| Ground electric potential ($V_{EE}$) | 0 V |
| Input voltage range of operational amplifier 22 | 0.3 V~3.0 V |
| Resistances ($R_X$) of first and second magnetic detection elements MR1, MR2 in zero magnetic field | 2.5 kΩ |
| Temperature coefficient of resistance ($TC_{MR}$) of first and second magnetic detection elements MR1, MR2 | −0.002° C.$^{-1}$ |
| Resistance value ($R_1$) of first resistor | 2.5 kΩ |
| Resistance value ($R_2$) of second resistor | 0 Ω |
| Temperature coefficient of resistance ($TC_R$) of first and second resistors R1, R2 | −0.002° C.$^{-1}$ |
| Maximum ambient temperature ($T_{MAX}$) | 150° C. |
| Minimum ambient temperature ($T_{MIN}$) | −40° C. |

Example 4

Figure 14:
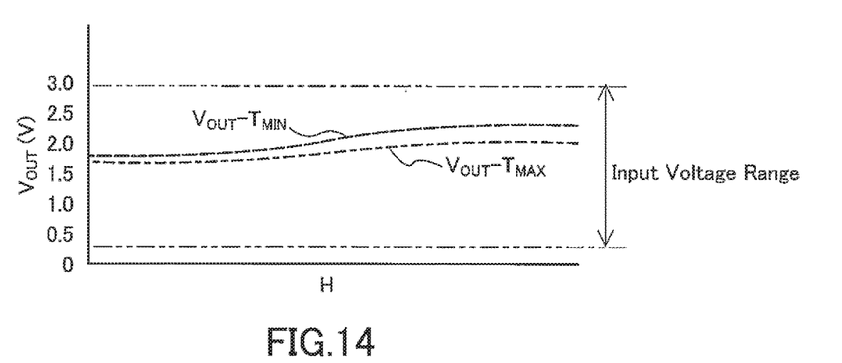
FIG. 14 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 4, and the magnetic field intensity H.

A simulation experiment was conducted in the same manner as in Example 3, except that the resistance value $R_2$ of the second resistor R2 was changed to 2.5 kΩ. The results are shown in FIG. 14.

Example 5

Figure 15:
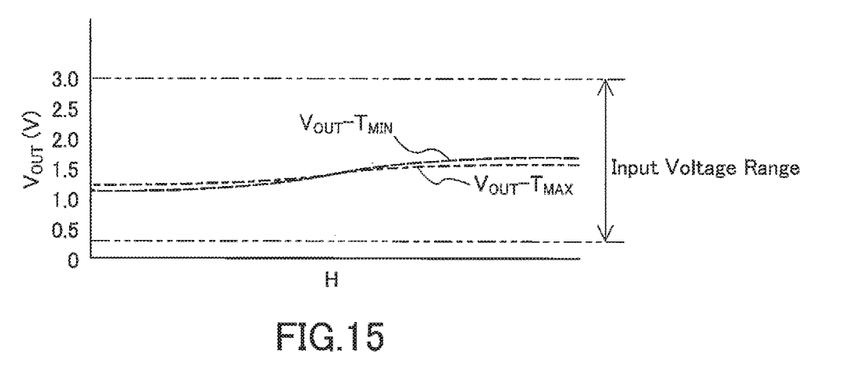
FIG. 15 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 5, and the magnetic field intensity H.

A simulation experiment was conducted in the same manner as in Example 4, except that the temperature coefficient of resistance $TC_R$ of the first resistor R1 and the second resistor R2 was changed to 0.005° C.$^{-1}$. Results are shown in FIG. 15.

Example 6

Figure 16:
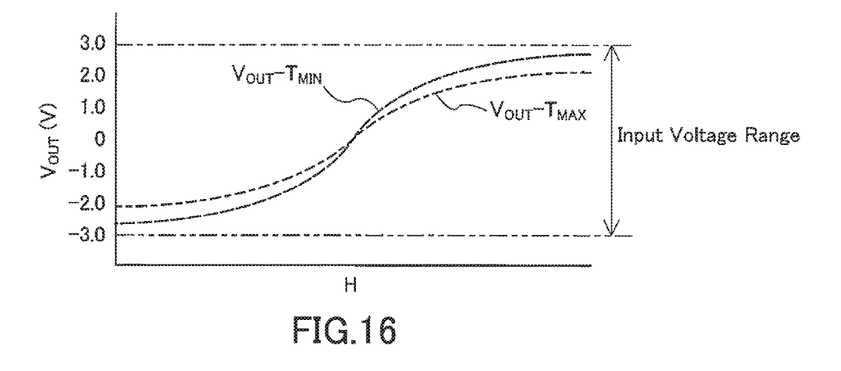
FIG. 16 is a graph showing the relationship between the output voltages (the output voltages $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuit according to Example 6, and the magnetic field intensity H.

A simulation experiment was conducted on the relationship between the output voltages of the circuit including the magnetic detection element circuit 21 shown in FIG. 2 having the Wheatstone bridge circuit C21, along with circuits including the first resistor R1 and the second resistor R2, and the input voltage range of the operational amplifier 22. The results are shown in FIG. 16. The first power source supply source $V_S$ was assumed to be a constant-voltage power source, and simulation conditions were set as shown in Table 3.

TABLE 3

| | |
|---|---|
| Electric potential ($V_S$) of first current supply source | 12 V |
| Ground electric potential ($V_G$) | 0 V |
| Electric potential ($V_{CC}$) of second current supply source | 3.3 V |
| Ground electric potential ($V_{EE}$) | −3.3 V |
| Input voltage range of operational amplifier 22 | −3.3 V~3.0 V |
| Resistances ($R_X$) of first through fourth magnetic detection elements MR1~MR4 in zero magnetic field | 2.5 kΩ |
| Temperature coefficient of resistance ($TC_{MR}$) of first through fourth magnetic detection elements MR1~MR4 | −0.002° C.$^{-1}$ |
| Resistance value ($R_1$) of first resistor | 1.5 kΩ |
| Resistance value ($R_2$) of second resistor | 1.5 Ω |
| Temperature coefficient of resistance ($TC_R$) of first and second resistors R1, R2 | −0.001° C.$^{-1}$ |
| Maximum ambient temperature ($T_{MAX}$) | 150° C. |
| Minimum ambient temperature ($T_{MIN}$) | −40° C. |

Comparison Example 2

Figure 17:
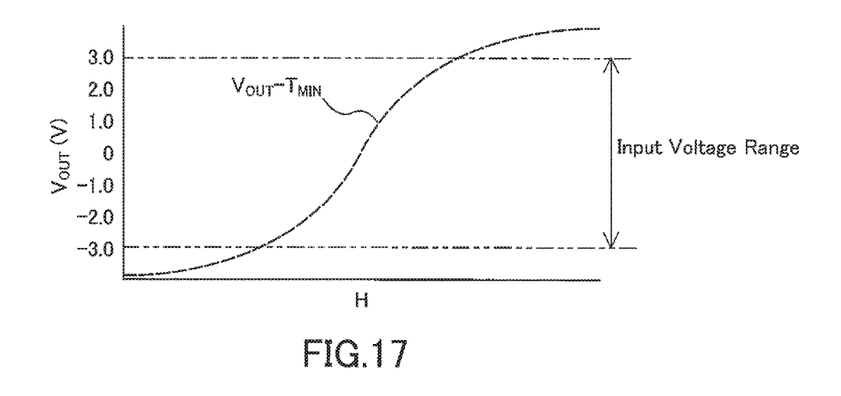
FIG. 17 is a graph showing the relationship between the output voltage (the output voltage $V_{OUT}$-$T_{MIN}$ at the minimum ambient temperature $T_{MIN}$) from the first magnetic detection element circuit according to Comparison Example 2, and the magnetic field intensity H.

A simulation experiment was conducted in the same manner as in Example 6, except that the resistance value $R_1$ of the first resistor R1 and the resistance value $R_2$ of the second resistor R2 were both changed to 0Ω. The results are shown in FIG. 17.

FIG. 10 through FIG. 17 are graphs showing the relationship between the magnetic field intensity H and the output voltages (the output voltage $V_{OUT}$-$T_{MAX}$, $V_{OUT}$-$T_{MIN}$ at the maximum ambient temperature $T_{MAX}$ and the minimum ambient temperature $T_{MIN}$, respectively) from the first magnetic detection element circuits 211 according to Examples 1~6, Comparison Example 1 and Comparison Example 2. The horizontal axis shows the magnetic field intensity H and the vertical axis shown the output voltage $V_{OUT}$ (V).

As shown in FIG. 10 through FIG. 17, it was confirmed that by positioning the first resistor R1 between the first power source supply source $V_S$ and the first output port E211 or the second output port E212 of the magnetic detection element circuit 21 and positioning the second resistor R2 between the ground (reference electric potential point) $V_G$ and the first output port E211 or the second output port E212, it is possible to control the detection signal $V_{OUT}$ output from the magnetic detection element circuit 21 to be within the input voltage range of the operational amplifier 22.

In addition, it was confirmed that by adjusting the resistance values $R_1$ and $R_2$ of the first resistor R1 and the second resistor R2, it is possible to effectively match the median value of the amplitude of the detection signal $V_{OUT}$ output from the magnetic detection element circuit 21 to the midpoint of the input voltage range of the operational amplifier 22 (see FIG. 11, FIG. 14 and FIG. 15).

Furthermore, it was confirmed that since the signs of the temperature coefficients of resistance of the first resistor R1 and second resistor R2 and the temperature coefficients of resistance of the first through fourth magnetic detection elements MR1~MR4 mutually differ, it is more difficult for the ambient temperature to have an effect, so that the detection signal $V_{OUT}$ can be output more stably from the magnetic detection element circuit 21.

And furthermore, since the resistance value $R_{X2}$ of the second magnetic detection element, the temperature coefficient of resistance $TC_{MR2}$ (° C.$^{-1}$) of the second magnetic detection element MR2, the resistance value $R_2$ of the second resistor R2 and the temperature coefficient of resistance $TC_{R2}$ (° C.$^{-1}$) of the second resistor R2 in a zero magnetic field have the relationship indicated by Equation (4) above, it is more difficult for the ambient temperature to have an effect, so that the detection signal $V_{OUT}$ can be output more stably from the magnetic detection element circuit 21 (see FIG. 15).

DESCRIPTION OF REFERENCE SYMBOLS

1 Magnetic sensor package
2 Magnetic sensor
21 Magnetic detection element circuit
211 First magnetic detection element circuit
212 Second magnetic detection element circuit
R1 First resistor
R2 Second resistor
22 Impedance matching device
221 First operational amplifier
222 Second operational amplifier
23 Arithmetic processing circuit
3 Sealing part
4 Base
5 Wiring part
6 Connection lead
30 Magnetic sensor

The invention claimed is:
1. A magnetic sensor comprising:
a magnetic detection element circuit that includes a first magnetic detection element and a second magnetic detection element, which are connected in series, and an output terminal, which is positioned between the first magnetic detection element and the second magnetic detection element;
an impedance matching device, which has a prescribed input voltage range, connected to the output terminal of the magnetic detection element circuit;
a first current supply source, which supplies an electric current to the magnetic detection element circuit; and
a second current supply source, which supplies an electric current to the impedance matching device;
wherein the second current supply source is a current supply source separated from the first current supply source and is not connected to an input terminal and an output terminal of the impedance matching device, and
a resistor is provided between the output terminal of the magnetic detection element circuit and the first current supply source and/or between the output terminal of the magnetic detection element circuit and a reference electric potential point.
2. The magnetic sensor according to claim 1, wherein the first magnetic detection element and the second magnetic detection element are magnetoresistance effect elements.
3. The magnetic sensor according to claim 1, wherein:
the resistor is composed by a material differing from that of the first magnetic detection element and the second magnetic detection element; and
the resistor has a temperature coefficient of resistance that differs from that of the first magnetic detection element and the second magnetic detection element.
4. The magnetic sensor according to claim 3, wherein the first magnetic detection element and the second magnetic detection element are GMR elements or TMR elements.
5. The magnetic sensor according to claim 4, wherein the first magnetic detection element and the second magnetic detection element have a negative temperature coefficient of resistance, and the resistor has a positive temperature coefficient of resistance.
6. The magnetic sensor according to claim 1, wherein the resistance values and temperature coefficients of resistance of the resistor provided between the output terminal of the magnetic detection element circuit and the first current supply source and the resistor provided between the output terminal of the magnetic detection element circuit and the reference electric potential point, and the resistance values and the temperature coefficients of resistance in a zero magnetic field of the first magnetic detection element and the second magnetic detection element have the relationship indicated by the following equation:

$$R_1 \times TC_{R1} + R^{X1} \times TC_{MR1} = R_2 \times TC_{R2} + R_{X2} \times TC_{MR2} = 0,$$

where $R_1$ indicates the resistance value (Ω) of the resistor provided between the output terminal of the magnetic detection element circuit and the first current supply source, $R_2$ indicates the resistance value (Ω) of the resistor provided between the output terminal of the magnetic detection element circuit and the reference electric potential point, $R_{X1}$ indicates the resistance value (Ω) of the first magnetic detection element in a zero magnetic field, $R_{X2}$ indicates the resistance value (Ω) of the second magnetic detection element in a zero magnetic field, $TC_{R1}$ indicates the temperature coefficient of resistance (° C.$^{-1}$) of the resistor provided between the output terminal of the magnetic detection element circuit and the first current supply source, $TC_{R2}$ indicates the temperature coefficient of resistance (° C.$^{-1}$) of the resistor provided between the output terminal of the magnetic detection element circuit and the reference electric potential point, $TC_{MR1}$ indicates the temperature coefficient of resistance (° C.$^{-1}$) of the first magnetic detection element, and $TC_{MR2}$ indicates the temperature coefficient of resistance (° C.$^{-1}$) of the second magnetic detection element.

7. The magnetic sensor according to claim 1, wherein the first current supply source is a constant-current supply source that supplies a constant electric current to the magnetic detection element circuit, and the second current supply source is a constant-voltage supply source that supplies a constant voltage to the impedance matching device.

8. The magnetic sensor according to claim 1, wherein the impedance matching device includes an operational amplifier.

9. The magnetic sensor according to claim 1, wherein the magnetic detection element circuit further contains a third magnetic detection element and a fourth magnetic detection element connected in series and includes a bridge circuit in which a series circuit of the first magnetic detection element and the second magnetic detection element and a series circuit of the third magnetic detection element and the fourth magnetic detection element are connected in parallel.

10. The magnetic sensor according to claim 9, wherein the magnetic detection element circuit further includes an output terminal, which is positioned between the third magnetic detection element and the fourth magnetic detection element, the input terminal of the impedance matching device includes a non-inverting input terminal and an inverting input terminal, the non-inverting input terminal is connected to the output terminal, which is positioned between the first magnetic detection element and the second magnetic detection element, and the inverting input terminal is connected to the output terminal, which is positioned between the third magnetic detection element and the fourth magnetic detection element.

11. The magnetic sensor according to claim 9, wherein the resistor is provided between one end of each of the first magnetic detection element and the third magnetic detection element and the first current supply source and/or one end of each of the second magnetic detection element and the fourth magnetic detection element and the reference electric potential point.

12. The magnetic sensor according to claim 1, wherein at least the first magnetic detection element and the second magnetic detection element are integrated on the same chip.

13. The magnetic sensor according to claim 1, further comprising a sealing part that integrally seals at least the first magnetic detection element, the second magnetic detection element and the resistor.

* * * * *